United States Patent
Le Tual et al.

(10) Patent No.: US 11,005,490 B2
(45) Date of Patent: May 11, 2021

(54) SAMPLING CIRCUIT

(71) Applicants: STMicroelectronics SA, Montrouge (FR); STMicroelectronics (Alps) SAS, Grenoble (FR)

(72) Inventors: Stéphane Le Tual, Saint-Égrève (FR); David Duperray, Saint-Ismier (FR); Jean-Pierre Blanc, Theys (FR)

(73) Assignees: STMICROELECTRONICS (ALPS) SAS, Grenoble (FR); STMICROELECTRONICS SA, Montrouge (FR)

(*) Notice: Subject to any disclaimer, the term of this patent is extended or adjusted under 35 U.S.C. 154(b) by 0 days.

(21) Appl. No.: 16/918,940

(22) Filed: Jul. 1, 2020

(65) Prior Publication Data

US 2021/0006256 A1    Jan. 7, 2021

(30) Foreign Application Priority Data

Jul. 4, 2019  (FR) ...................................... 1907471

(51) Int. Cl.
*H03M 1/12* (2006.01)
*H01L 29/78* (2006.01)
*G11C 27/02* (2006.01)

(52) U.S. Cl.
CPC ......... *H03M 1/1245* (2013.01); *G11C 27/024* (2013.01); *H01L 29/78* (2013.01)

(58) Field of Classification Search
CPC ..... H03M 1/1245; H01L 29/78; G11C 27/024
USPC ................. 341/122, 155; 327/91, 93, 94, 96
See application file for complete search history.

(56) References Cited

U.S. PATENT DOCUMENTS 4,393,318 A * 7/1983 Takahashi ............. G11C 27/02
                                                    257/300
8,638,124 B1 * 1/2014 Feng ................. G01R 31/31727
                                                    327/3
9,264,034 B2 * 2/2016 Kim ..................... H03K 17/687

FOREIGN PATENT DOCUMENTS

EP     0041427 A1    12/1981
EP     0275590 A2     7/1988

* cited by examiner

*Primary Examiner* — Khai M Nguyen
(74) *Attorney, Agent, or Firm* — Slater Matsil, LLP

(57) ABSTRACT

A sampling circuit includes a metal oxide semiconductor (MOS) transistor that includes a third metallization receiving a reference voltage between a first metallization coupled to a source region of the transistor and a second metallization coupled to a drain region of the transistor.

20 Claims, 3 Drawing Sheets

SAMPLING CIRCUIT

CROSS-REFERENCE TO RELATED APPLICATIONS

This application claims the priority of French Application No. 1907471 filed on Jul. 4, 2019, which application is hereby incorporated herein by reference.

TECHNICAL FIELD

The present disclosure generally concerns electronic circuits and their application in the sampling of analog signals. More particularly, the present disclosure concerns a sampling circuit.

BACKGROUND

The sampling of a signal is a phase during which an analog signal is converted into a discrete series of values. For this purpose, values of the signal are sampled at defined intervals, generally, regular intervals. A sampling circuit is an electronic circuit capable of implementing such a phase, its function thus is to record and to store a value of a signal, at a first time, into a new signal, and of holding this voltage value constant until a second sampling time.

The sampling of an analog signal often is the first step of a conversion to a digital signal. Thus, a sampling circuit may form part of a device of conversion of an analog signal into a digital signal (ADC, Analog to Digital Converter).

It would be desirable to at least partly improve certain aspects of known sampling circuits.

SUMMARY

In an embodiment, a sampling circuit includes a metal oxide semiconductor (MOS) transistor that includes a third metallization receiving a reference voltage between a first metallization coupled to a source region of the transistor and a second metallization coupled to a drain region of the transistor.

In an embodiment, an analog to digital converter comprises a sampling circuit to convert an analog signal into discrete series of values. The sampling circuit comprises a field effect transistor that includes a source region, a drain region, a channel region disposed between the source region and the drain region, a gate stack disposed over the channel region, an insulating layer disposed over the gate stack, a first via coupling the source region, a first metal line disposed over the insulating layer and electrically coupled to the first via, a second via coupling the drain region, a second metal line disposed over the insulating layer and electrically coupled to the second via, and a third metal line disposed over the insulating layer. The first metal line, the second metal line, and the third metal line are at a same metallization layer. The third metal line is shorter in length than the first metal line and the second metal line.

In an embodiment, a method of converting an analog signal to a digital signal includes converting the analog signal into discrete series of values at a sampling circuit. The sampling circuit comprises a field effect transistor that includes a source region, a drain region, a channel region disposed between the source region and the drain region, a gate stack disposed over the channel region, an insulating layer disposed over the gate stack, a first via coupling the source region, a first metal line disposed over the insulating layer and electrically coupled to the first via, a second via coupling the drain region, a second metal line disposed over the insulating layer and electrically coupled to the second via, and a third metal line disposed over the insulating layer. The first metal line, the second metal line, and the third metal line are at a same metallization layer. The third metal line is shorter in length than the first metal line and the second metal line.

DETAILED DESCRIPTION OF ILLUSTRATIVE EMBODIMENTS

Figure 1:
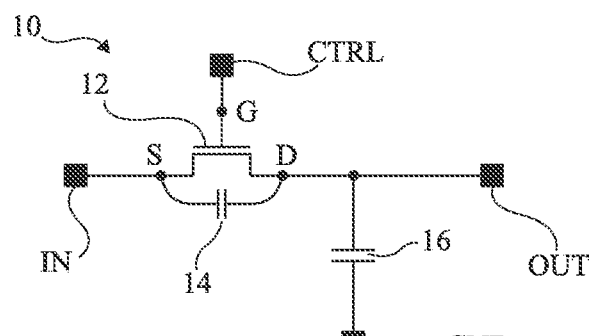
FIG. 1 shows an electronic diagram of a sampling circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

There is a need for higher-performance sampling circuits.

There is a need for sampling circuits capable of holding a constant voltage value between two sampling times.

An embodiment overcomes all or part of the disadvantages of known sampling circuits.

An embodiment provides a sampling circuit comprising at least one MOS transistor comprising, between a first metallization coupled to a source region of the transistor and a second metallization coupled to a drain region of the transistor, a third metallization receiving a reference voltage.

According to an embodiment, the third metallization has a length shorter than or equal to the length of the gate stack of the transistor.

According to an embodiment, the third metallization has the same length as a gate stack of the transistor.

According to an embodiment, the third metallization has a length equal to half the length of the gate stack of the transistor.

According to an embodiment, the third metallization has a length equal to approximately 20% of the length of the gate stack of the transistor.

According to an embodiment, the third metallization comprises at least two non-contiguous portions.

According to an embodiment, the third metallization comprises two non-contiguous portions.

According to an embodiment, the portions of the third metallization have a length equal to approximately 20% of the length of the gate stack of the transistor.

According to an embodiment, the reference voltage is the ground.

The foregoing and other features and advantages will be discussed in detail in the following non-limiting description of specific embodiments in connection with the accompanying drawings.

FIG. 1 is an electronic diagram of a sampling circuit 10.

Circuit 10 comprises, between an input terminal IN and an output terminal OUT, a MOS transistor 12, for example, of type N. As an example, source S of transistor 12 is coupled, preferably connected, to input terminal IN and drain D of transistor 12 is coupled, preferably connected, to terminal OUT. Gate G of transistor 12 is coupled, preferably connected, to a control terminal CTRL of circuit 10. A stray capacitance located between the source region and the drain region of transistor 12 is represented by a capacitor 14, in FIG. 1, coupling the source and the drain of transistor 12.

Circuit 10 further comprises a capacitor 16. An electrode of capacitor 16 is coupled, preferably connected, to output terminal OUT of circuit 10. The other electrode of capacitor 16 is coupled, preferably connected, to a terminal GND receiving a reference voltage, for example, the ground.

Figure 2:
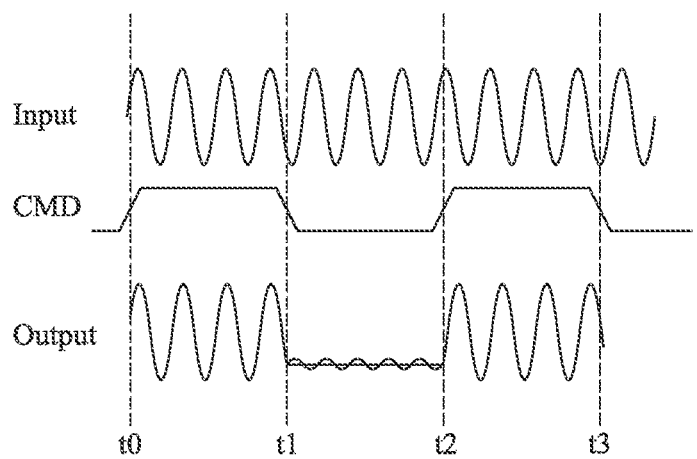
FIG. 2 shows timing diagrams of signals of the sampling circuit of FIG. 1.

The operation of circuit 10 is detailed in relation with FIG. 2.

FIG. 2 shows shapes of signals at the different terminals of the circuit 10 described in relation with FIG. 1. More particularly, FIG. 2 comprises the curves of the following signals: an analog signal Input to be sampled, or input signal, received on input terminal IN of circuit 10; a control signal CMD applied to control terminal CTRL of circuit 10; and an analog sampled signal Output, or output signal, delivered on output terminal OUT of circuit 10.

Analog signal Input is, in the example shown in FIG. 2, a sine-wave signal but may in practice have any shape.

Control signal CMD is a digital signal varying between a low state and a high state. The high state for example is a voltage level equal to the voltage level of a power supply voltage, and the low state is, for example, a voltage level equal to the voltage level of a reference voltage.

Between a time t0 and a time t1, control signal CMD switches from a low state to a high state. Transistor 12 is then on and capacitor 16 charges. Output signal Output is, meanwhile, equal to input signal Input.

Between time t1 and a time t2, control signal CMD switches to a low state. Transistor 12 is then off and capacitor 16 remains charged and the voltage level thereacross is equal to the voltage level of input signal Input at time t1. Output signal Output is then equal to a voltage, theoretically constant with a level equal to the voltage level of input signal Input at time t1. A sample of signal IN is then formed.

However, the stray capacitance from capacitor 14 of transistor 12 is capable of giving way to a portion of input signal Input (symbolized by small variations proportional to signal Input in FIG. 2). More particularly, stray capacitance from capacitor 14 may give way to input signal Input by attenuating it and, for example, by phase-shifting it.

Between time t2 and a time t3, control signal CMD switches to a high state. Transistor 12 is on again, and capacitor 16 recharges before a new switching to the low state.

Figure 3:
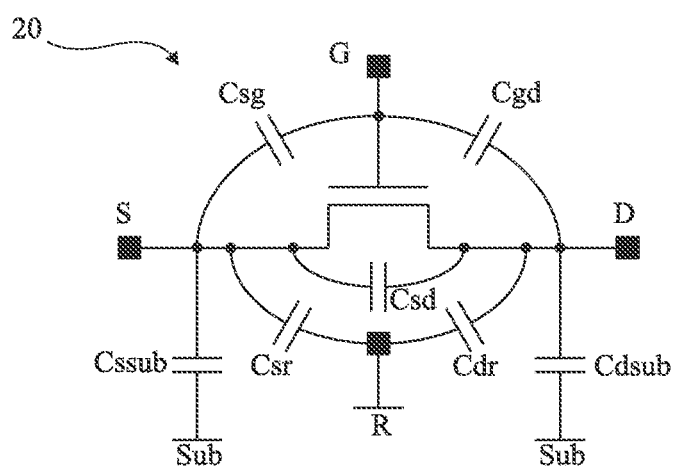
FIG. 3 shows an electronic diagram of an embodiment of a transistor of the sampling circuit of FIG. 1.

FIG. 3 is an electric diagram of an embodiment of a field effect transistor 20. Transistor 20 is a metal oxide semiconductor (MOS) transistor, for example, of type N. Transistor 20 may replace transistor 12 in the circuit 10 described in relation with FIG. 1.

Conventionally, transistor 20 comprises source, drain, and gate contacts, S, D, and G.

Transistor 20 further comprises, between its source and drain contacts, S and D, a contact R coupled, preferably connected, to a reference node of sampling circuit 10. The reference node is a low-impedance node enabling to stop the electric field lines (cold node or dynamic mass). The reference node is for example coupled to ground or to a reference voltage of circuit 10.

In practice, contact R is formed by a metallization arranged between the metallizations enabling to form source contact S and drain contact D of transistor 20. Embodiments of a structure of transistor 20 are described in relation with FIGS. 4 to 9.

Stray capacitances of transistor 20 have been shown in FIG. 3. These capacitances are the following: a capacitor Csg symbolizing the stray capacitance between the source and gate contacts, S and G, of transistor 20; a capacitor Cgd symbolizing the stray capacitance between the gate and drain contacts, G and D, of transistor 20; a capacitor Csd symbolizing the stray capacitance between the source and drain contacts, S and D, of transistor 20; a capacitor Cssub symbolizing the stray capacitance between the source contact S and substrate Sub of transistor 20; a capacitor Cdsub symbolizing the stray capacitance between the drain contact D and substrate Sub of transistor 20; a capacitor Csr symbolizing the stray capacitance between the source and reference contact, S and R, of transistor 20; and a capacitor Cdr symbolizing the stray capacitance between the drain and reference contact, D and R, of transistor 20.

The stray capacitance Cs seen by a signal received at the level of the source contact S of transistor 20 is equal to the sum of stray capacitances Csd, Csg, Cssub, and Csr. Similarly, the stray capacitance Cd seen by a signal received at the level of the drain contact D of transistor 20 is equal to the sum of stray capacitances Csd, Cgd, Cdsub, and Cdr.

The stray capacitance Csd present between the source and drain contacts is decreased with respect to the stray capacitance from capacitor 14 illustrated in relation with FIG. 1. Indeed, the presence of the reference contact enables to redirect part of the portion of a signal entering on source contact S to reference node R rather than to drain contact D.

Figure 4:
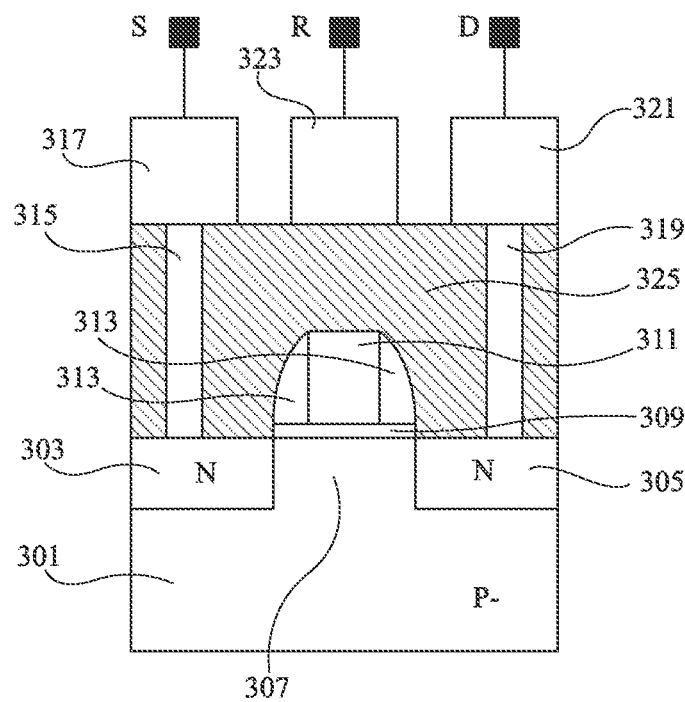
FIG. 4 is a cross-section view of the embodiment of the transistor of FIG. 3.

FIG. 4 is a cross-section view of an embodiment of a transistor 300 of the type of the transistor 20 described in relation with FIG. 3.

Transistor 300 is formed, for example, on a solid substrate 301, for example, lightly P-type doped (P−). As a variation, transistor 300 may be formed inside and on top of a silicon-on-insulator structure (SOI). Transistor 300 comprises two wells 303 and 305, for example, N-type doped, extending from an upper surface of substrate 301. Well 303 forms the source region of transistor 300, and well 305 forms the drain region of transistor 300. Wells 303 and 305 are separated by a region of substrate 307, called channel-forming region. A gate insulator layer 309 is formed on an upper surface of region of substrate 307. A gate stack 311, laterally protected by spacers 313, is arranged on gate insulator layer 309.

Source contact S is formed by a metallization 317, connected to source region 303 by a via 315. Metallization 317 may be coupled to other metallization levels, not shown in FIG. 4.

Drain contact D is formed by a metallization 321, connected to drain region 305 by a via 319. Metallization 321 may be coupled to other metallization levels, not shown in FIG. 4.

Reference contact R is formed by a metallization 323 arranged between metallizations 317 and 321 forming part of source and drain contacts, S and D. Metallization 323 is arranged at the same level as metallizations 317 and 321. Metallization 323 is for example made of a same material as metallizations 317 and 321, or of a different material. Metallization 323 is for example made of an alloy comprising copper.

Vias 315 and 319 are for example formed in an insulating layer 325 (hatched in FIG. 4) protecting the structure of transistor 300, and metallizations 317, 321, and 323 are for example formed on an upper surface of insulating layer 325.

Metallization 323 may have, in top view, different shapes which will be described in relation with FIGS. 5 to 9.

Figures 5, 6:
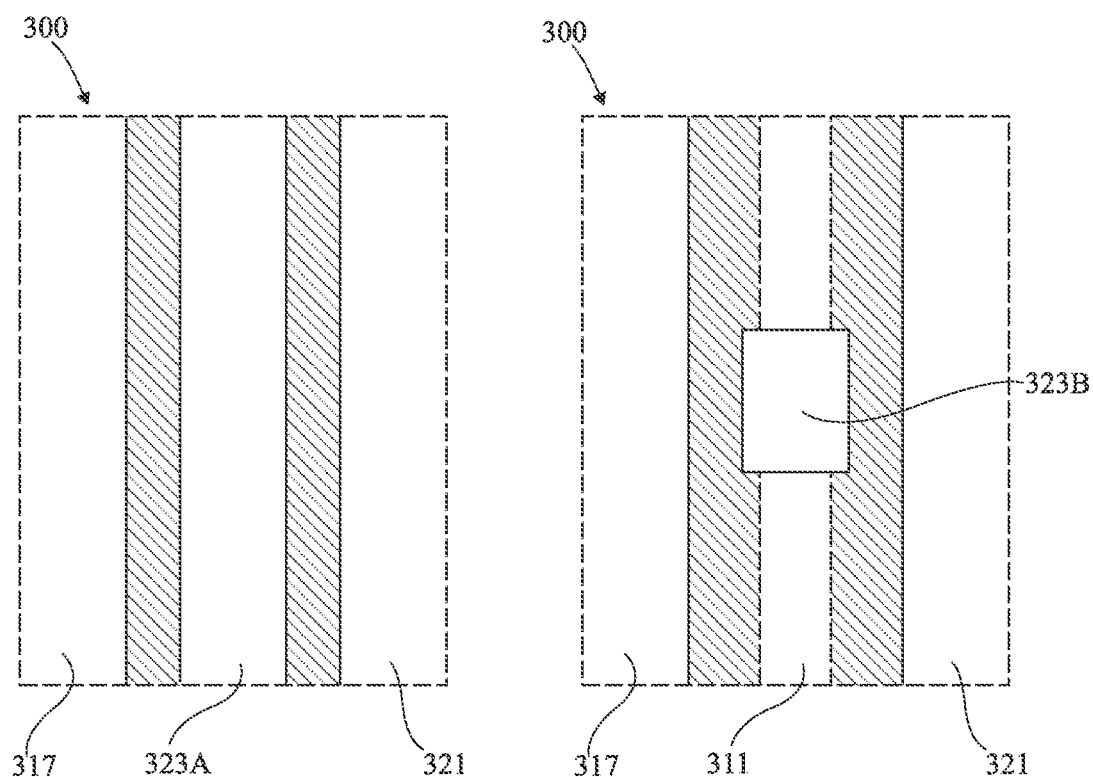
FIG. 5 shows a top view of an embodiment of the transistor of FIG. 3.
FIG. 6 shows a top view of another embodiment of the transistor of FIG. 3.

FIG. 5 is a top view of transistor 300, described in relation with FIG. 4, and illustrating an example of the shape of metallization 323, noted metallization 323A.

Metallizations 317, forming source contact S, and 321, forming drain contact D, have a rectangular shape and are parallel to one another. Further, metallizations 317 and 321 extend all along the length of transistor 300.

In this example, metallization 323A has a rectangular shape and is parallel to metallizations 317 and 321. Further, metallization 323A extends all along the length of the gate of transistor 300.

FIG. 6 is a top view of transistor 300, described in relation with FIG. 4, and illustrating another example of the shape of metallization 323, noted metallization 323B.

Metallizations 317 and 321 are identical to those described in relation with FIG. 5. The width of gate stack 311 of transistor 300 is shown in dotted lines in FIG. 6.

In this example, metallization 323B has a rectangular shape and is parallel to metallizations 317 and 321. Further, metallization 323B only extends over a portion of transistor 300. This portion for example represents in the order of 20% of the total length of the gate of transistor 300.

Figure 7:
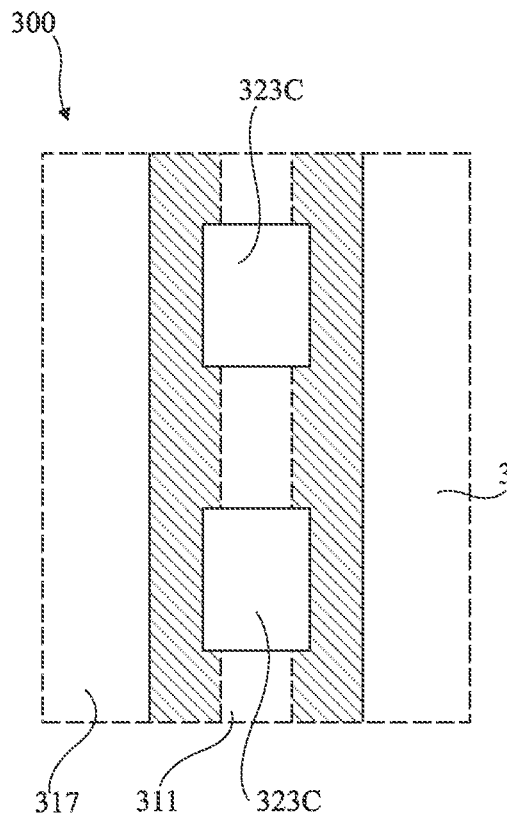
FIG. 7 shows a top view of another embodiment of the transistor of FIG. 3.

FIG. 7 is a top view of transistor 300, described in relation with FIG. 4, and illustrating another example of the shape of metallization 323, noted metallization 323C.

Metallizations 317 and 321 are identical to those described in relation with FIG. 5. The width of gate stack 311 of transistor 300 is shown in dotted lines in FIG. 7.

In this example, metallization 323C comprises a plurality of non-contiguous portions, for example, at least two portions. In FIG. 7, metallization 323C comprises two non-contiguous portions. Each portion is rectangular and is parallel to metallizations 317 and 321. Each portion for example represents in the order of 20% of the total length of the gate of transistor 300.

Figure 8:
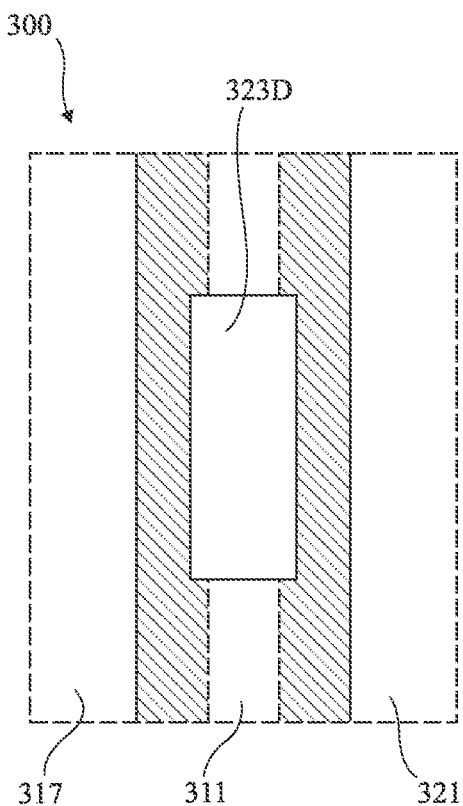
FIG. 8 shows a top view of another embodiment of the transistor of FIG. 3.

FIG. 8 is a top view of transistor 300, described in relation with FIG. 4, and illustrating another preferred example of the shape of metallization 323, noted metallization 323D.

Metallizations 317 and 321 are identical to those described in relation with FIG. 5. The width of the gate stack 311 of transistor 300 is shown in dotted lines in FIG. 6.

In this preferred example, metallization 323D has a rectangular shape and is parallel to metallizations 317 and 321. Further, metallization 323B only extends over a portion of transistor 300. This portion represents approximately half of the total length of the gate of transistor 300.

Figure 9:
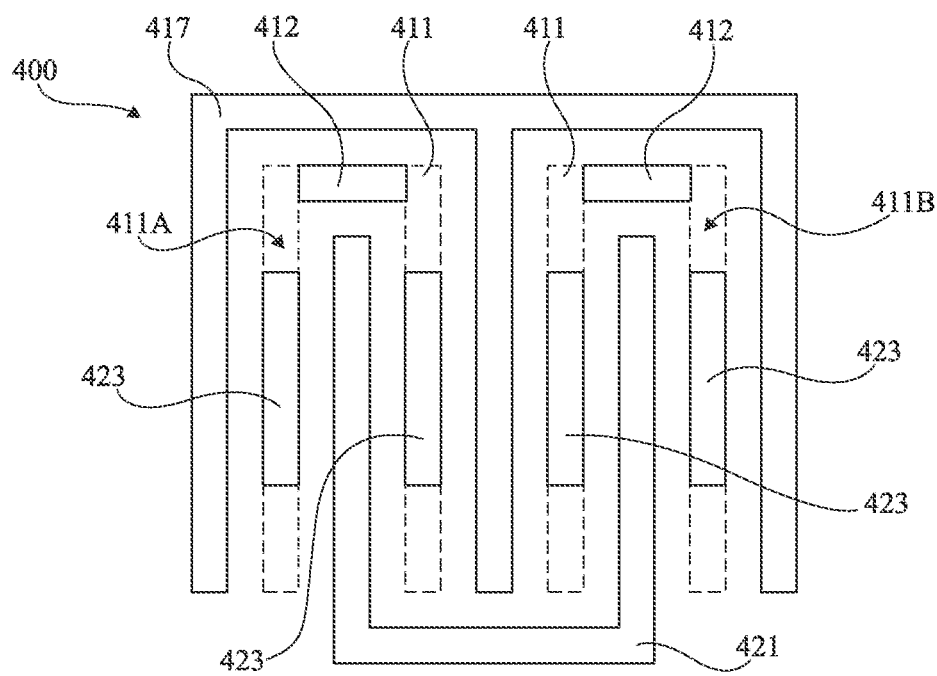
FIG. 9 shows a top view of another embodiment of the transistor of FIG. 3.

FIG. 9 is a simplified top view of a transistor 400 of the type of the transistor 300 described in relation with FIGS. 4 to 8. Transistor 400 comprises the same elements as transistor 300 but the shape of these elements is different. Although the transistor 400 described hereafter is a transistor comprising four "fingers", as a variation, transistor 400 may comprise at least two fingers.

Indeed, transistor 400 comprises a gate stack 411, symbolized in FIG. 9 by dotted lines, comprising, in top view, at least two portions 411A and 411B, in the shape of an upside-down U, arranged parallel and next to each other. Each of these portions is, for example, coupled to a gate metallization 412 by one or a plurality of vias (not shown in FIG. 9). Each gate metallization 412 is for example arranged above the horizontal portion of the portion 411A and 411B of the stack 411 that it tops. Each vertical portion of the portions 411A and 411B of the gate region forms a "finger" of transistor 400.

Transistor 400 further comprises a source region 403 comprising at least three rectangular portions (not shown in FIG. 9), one portion being arranged between and along the two portions 411A and 411B, and the two other portions being arranged on the outer sides of portions 411A and 411B. The three portions of source region 403 are all parallel to one another. All the portions of source region 403 are coupled to a comb-shaped source metallization 417 having at least three teeth, each tooth being arranged above a portion of source region 403.

Transistor 400 further comprises a drain region 405 comprising at least two rectangular portions (not shown in FIG. 9), each portion being arranged inside of a portion 411A or 411B of gate stack 411. All the portions of drain region 405 are coupled to a U-shaped drain metallization 421 having a direction inverted with respect to portions 411A and 411B. Each vertical portion of metallization 421 is arranged above a portion of drain region 405.

Transistor 400 comprises metallizations 423 of the type of the metallization 323 described in relation with FIG. 4. Metallizations 423 have a rectangular shape and a length equal to approximately half the length of a "finger" of transistor 400. Metallizations 423 are arranged above the vertical portions of the portions 411A and 411B of gate stack 411.

An advantage of the embodiments described in relation with FIGS. 3 to 9 is that the presence of reference metallizations R, 323, or 423 enables to decrease the stray capacitance between the source contact and the drain contact of transistor 20, 300, or 400. More particularly, the presence of the reference metallization may enable to divide the stray capacitance by a quantity in the range from, for example, 1.5 to 4. Another effect of adding the reference metallization is a potential increase of stray source capacitance Cs, for example, likely to range from 10% to 40%, and a potential increase in the stray drain capacitance Cd, par for example, likely to range from 10% to 40%. A good compromise is the embodiment described in relation with FIGS. 8 and 9 where the stray capacitance between the source contact and the drain contact is divided by at least 2, and where the increase in the stray source and drain capacitances is, for example, only in the order of 20%. According to the application and the nature of the signals received by the MOS transistor, it will be within the abilities of those skilled in the art to adapt the dimensions and the shape of the reference metallization to obtain satisfactory stray capacitances.

Various embodiments and variations have been described. It will be understood by those skilled in the art that certain features of these various embodiments and variations may be combined, and other variations will occur to those skilled in the art. In particular, other MOS transistor shapes or structures may be envisaged. Further, the reference metallization shapes described in relation with FIGS. 5 to 8 may be combined with the embodiment of a transistor described in relation with FIG. 9.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A sampling circuit comprising:
    a metal oxide semiconductor (MOS) transistor comprising, between a first metallization coupled to a source region of the transistor and a second metallization coupled to a drain region of the transistor, a third metallization receiving a reference voltage.

2. The circuit of claim 1, wherein the third metallization has a length shorter than or equal to the length of a gate stack of the transistor.

3. The circuit of claim 1, wherein the third metallization has the same length as a gate stack of the transistor.

4. The circuit of claim 1, wherein the third metallization has a length equal to half the length of a gate stack of the transistor.

5. The circuit of claim 1, wherein the third metallization has a length equal to approximately 20% of the length of a gate stack of the transistor.

6. The circuit of claim 1, wherein the third metallization comprises at least two non-contiguous portions.

7. The circuit of claim 6, wherein the third metallization comprises two non-contiguous portions.

8. The circuit of claim 6, wherein the portions of the third metallization have a length equal to approximately 20% of the length of a gate stack of the transistor.

9. The circuit of claim 1, wherein the reference voltage is a ground potential.

10. An analog to digital converter comprising:
    a sampling circuit to convert an analog signal into discrete series of values, the sampling circuit comprising a field effect transistor comprising:
        a source region,
        a drain region,
        a channel region disposed between the source region and the drain region,
        a gate stack disposed over the channel region;
        an insulating layer disposed over the gate stack;
        a first via coupling the source region;
        a first metal line disposed over the insulating layer and electrically coupled to the first via;
        a second via coupling the drain region;
        a second metal line disposed over the insulating layer and electrically coupled to the second via; and
        a third metal line disposed over the insulating layer, the first metal line, the second metal line, and the third metal line being at a same metallization layer, the third metal line being shorter in length than the first metal line and the second metal line.

11. The circuit of claim 10, wherein the third metallization has a length shorter than or equal to the length of the gate stack of the transistor.

12. The circuit of claim 10, wherein the third metallization has the same length as a gate stack of the transistor.

13. The circuit of claim 10, wherein the third metallization has a length equal to half the length of the gate stack of the transistor.

14. The circuit of claim 10, wherein the third metallization has a length equal to approximately 20% of the length of the gate stack of the transistor.

15. The circuit of claim 10, wherein the third metallization comprises at least two non-contiguous portions.

16. The circuit of claim 15, wherein the third metallization comprises two non-contiguous portions.

17. The circuit of claim 15, wherein the portions of the third metallization have a length equal to approximately 20% of the length of the gate stack of the transistor.

18. The circuit of claim 10, wherein the third metal line is electrically coupled to a reference potential node.

19. The circuit of claim 18, wherein the reference potential node is a ground potential node.

20. A method of converting an analog signal to a digital signal, the method comprising:
    converting the analog signal into discrete series of values at a sampling circuit, the sampling circuit comprising a field effect transistor comprising:
        a source region,
        a drain region,
        a channel region disposed between the source region and the drain region,
        a gate stack disposed over the channel region;
        an insulating layer disposed over the gate stack;
        a first via coupling the source region;
        a first metal line disposed over the insulating layer and electrically coupled to the first via;
        a second via coupling the drain region;
        a second metal line disposed over the insulating layer and electrically coupled to the second via; and
        a third metal line disposed over the insulating layer and electrically coupled to a reference potential node, the first metal line, the second metal line, and the third metal line being at a same metallization layer, the third metal line being shorter in length than the first metal line and the second metal line.

* * * * *